United States Patent [19]

Ciraula et al.

[11] Patent Number: 4,969,125
[45] Date of Patent: Nov. 6, 1990

[54] ASYNCHRONOUS SEGMENTED PRECHARGE ARCHITECTURE

[75] Inventors: Michael K.. Ciraula; Christopher Mc. Durham, both of Manassas; Reginald E. Harrison, Falls Church; Derwin J. Jallice, Reston; Dave C. Lawson; Craig L. Stephen, both of Manassas, all of, Va.

[73] Assignee: International Business Machines Corporation, Armonk, N.Y.

[21] Appl. No.: 370,941

[22] Filed: Jun. 23, 1989

[51] Int. Cl.⁵ .............................................. G11C 11/40
[52] U.S. Cl. ................................ 365/203; 365/230.03; 365/233.5
[58] Field of Search ................. 365/203, 233.5, 238.5, 365/230.03

[56] References Cited

U.S. PATENT DOCUMENTS

| | | | |
|---|---|---|---|
| 4,520,465 | 5/1985 | Sood | 365/203 |
| 4,528,646 | 7/1985 | Ochii et al. | 365/203 |
| 4,592,026 | 5/1986 | Matsukawa et al. | 365/203 |
| 4,594,689 | 6/1986 | Donoghue | 365/182 |
| 4,602,354 | 7/1986 | Craycraft et al. | 365/203 |
| 4,612,631 | 9/1986 | Ochii | 365/203 |
| 4,656,610 | 4/1987 | Yoshida et al. | 365/230.03 X |
| 4,710,901 | 12/1987 | Kumanoya et al. | 365/190 |
| 4,730,279 | 3/1988 | Ohtani | 365/203 |
| 4,742,487 | 5/1988 | Bernstein | 365/203 X |
| 4,780,852 | 10/1988 | Kajigaya et al. | 365/203 |
| 4,839,860 | 6/1989 | Shinoda et al. | 365/230.03 X |

*Primary Examiner*—Joseph A. Popek

*Attorney, Agent, or Firm*—John E. Hoel; Mark A. Wurm

[57] ABSTRACT

An improved memory array having row address inputs connected to a row address decoder and column address inputs connected to a column address decoder, the row address decoder and column address decoder having an address bus connected thereto, the memory being organized into an array of word lines organized into rows and columns having a pair of bit lines for each column, the improvement comprising, segmenting the array into a plurality of segments, each segment containing a portion of all of the bit lines; a bit equalization circuit for each segment, to equalize the potential on each bit line in the bit line pair when activated; an equalization circuit control means, having an input coupled to the input address lines, and an output connected to each equalization circuit on each respective segment of the array, for enabling the equalization circuits on those segments of the array which are not selected by the input address and for disabling the equalization circuits on that segment of the array which is selected by the input address; the bit line pairs in the non-selected circuits being maintained in an equal potential state so that when one of the bit lines in a bit line pair in a non-selected segment suffers a discharge due to an ionizing radiation effect, the activated equalization circuit on the non-selected segment will equalize the potential thereof; whereby the radiation immunity of the memory array is improved. The resulting memory array has enhanced radiation hardness, reduced power dissipation, and is capable of static page mode operation.

4 Claims, 9 Drawing Sheets

A - ACTIVE
I - INACTIVE

| SECTION DECODE | ATD | PRECHARGE STATE |
|---|---|---|
| I | I | A |
| I | A | A |
| A | I | I |
| A | A | A |

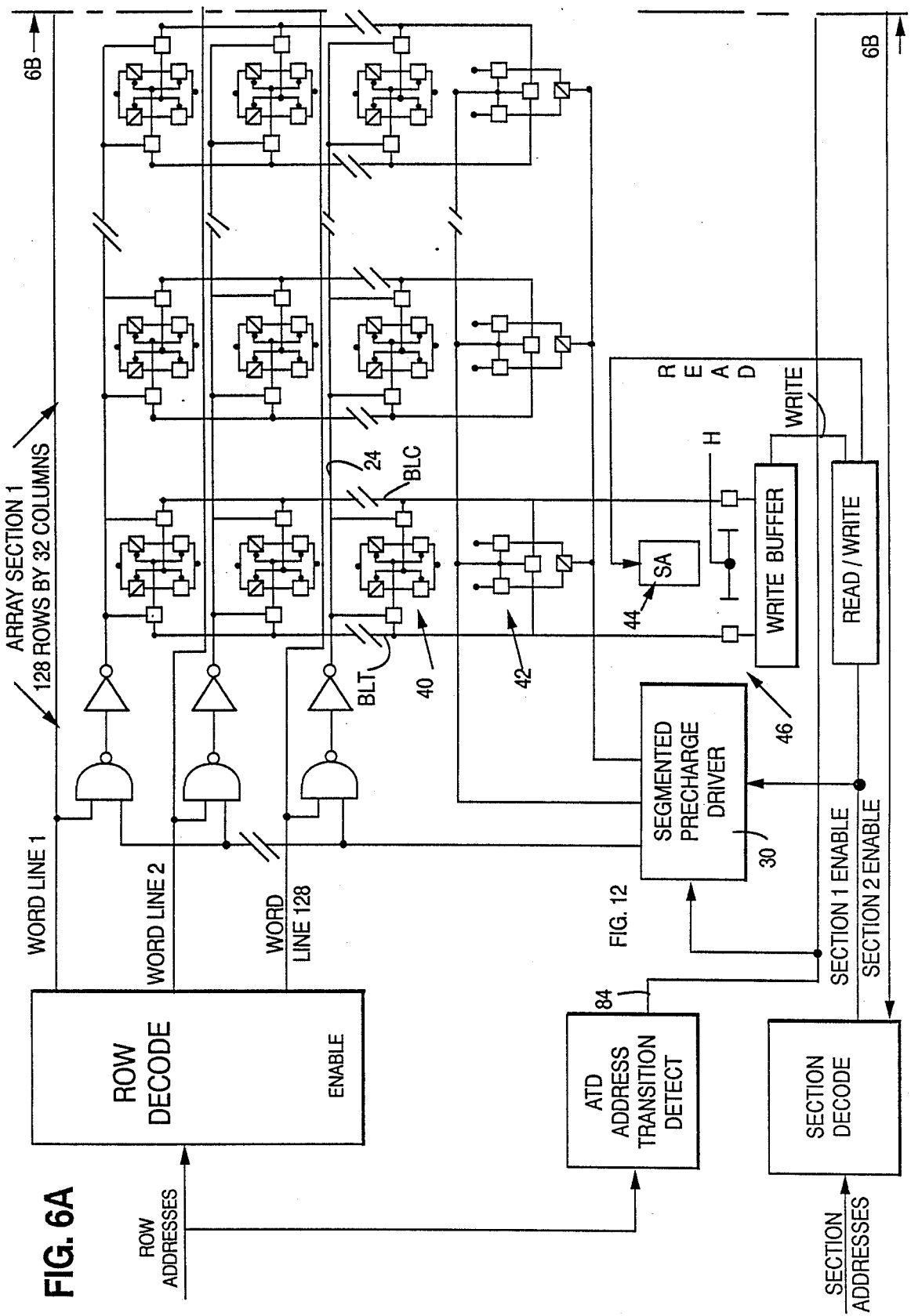

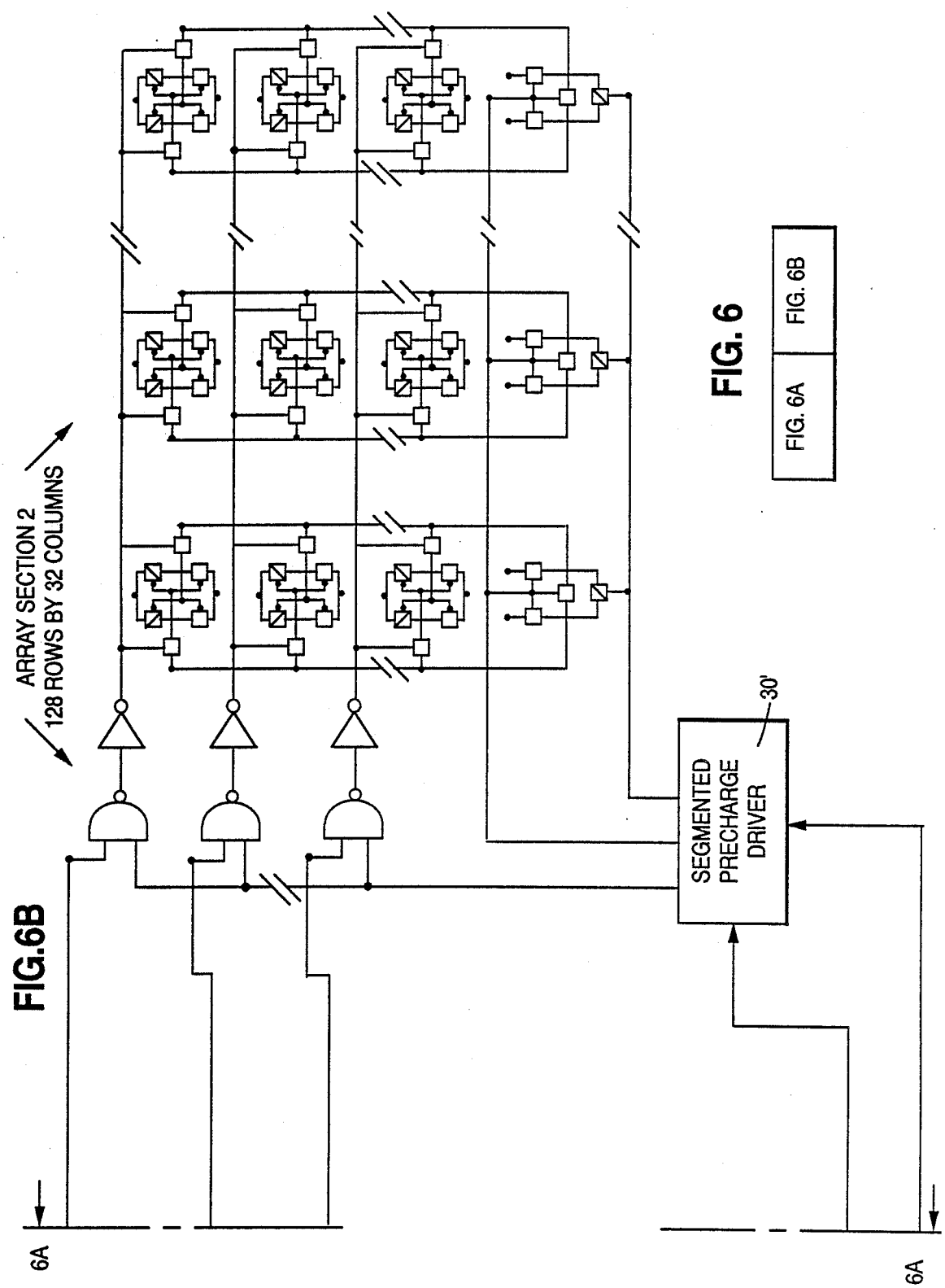

ASYNCHRONOUS SEGMENTED PRECHARGE ARCHITECTURE

This invention was made with Government support under Contract Number F29601-87-C-0006 awarded by the Department of the Air Force. The Government has certain rights in this invention.

BACKGROUND OF THE INVENTION

1. Technical Field

The invention disclosed broadly relates to memory technology and more particularly relates to improved FET memory arrays.

2. Background Art

The segmented precharge architecture is an extension of the segmented word line architecture (also termed double word line scheme, block oriented die architecture, and divided word line architecture). This scheme reduces power dissipation by reducing the number of active columns (bit lines). The vast majority of SRAMs equal to or larger than 64K use the segmented word line architecture.

FIG. 1 shows a typical prior art implementation of the segmented word line architecture. The memory is broken into two sections 1 and 2. The row addresses are decoded and select one of 128 main word lines WL0 to WL127. The section addresses are decoded and select one of two sections 1' or 2' to enable. The main word line e.g. WL0 and the section enable 20 are combined via AND gates, and select one word line 24 in one section 1' of the chip. Notice that the chip contains a total of 64 columns (two sections 1' and 2' with 32 columns each), but only 32 columns are active at any time. This scheme can be extended to any number of blocks.

The typical prior art implementation of the precharge scheme is also shown in FIG. 1. The Address Transition Detect (ATD) circuit generates a pulse when any of the row or section addresses change. The pulse generated by the ATD circuit disables the row decoder, thus deactivating all word lines, and precharging (equalizing) the bit lines. At the completion of the ATD pulse, the bit line precharge is turned off and a new word line is activated. Note that the start of the read access (when new word line goes up) is delayed by the ATD pulse (see FIG. 2).

Since generating an ATD pulse extends the read cycle, the ATD pulse should be generated only when absolutely necessary. For this reason the column addresses do not feed the ATD circuit, and changing a column address does not cause an ATD pulse. Eliminating the ATD pulse from the column access, produces a column access that is faster than either a row or section access. This fast column access is termed static page mode. For the typical prior art scheme shown in FIG. 1, the number of columns available in the static page mode is limited to the number of columns in a section (i.e., 32) regardless of the number of sections.

It is important to understand why changing a row or section address must cause an ATD pulse, while changing the column address does not. When a row address changes, the word line that is on turns off, and a word line that was previously off turns on. The voltage difference on the bit lines represents the value of the data stored in the cell whose word line is turning off. When the new word line turns on this voltage delta may overdrive the data in the new cell; thus writing data into the cell instead of reading it. In order to prevent writing into the new cell, the data from the old cell must be removed from the bit lines, i.e., the bit lines must be precharged.

A similar situation exists when a section address changes. When a section is not selected, its bit lines are floating in the prior art. The bit lines are floating for varying amounts of time depending on how frequently the section is accessed. Junction leakage, capacitance coupling, alpha particles, and single event upset (SEU) can produce a voltage delta on the bit lines large enough to write into the cell during a read access. Thus, changing a section address must result in an ATD pulse to perform a precharge.

Also note, as shown in FIG. 1, the ATD pulse switches all bit line precharge devices simultaneously. This causes large current spikes which generate noise and can cause the voltage at the power pad to droop due to package (pin) inductance. In addition, in the typical scheme shown in FIG. 1, precharge is active only during the ATD pulse, a very small portion of the cycle; thus, most of the bit lines are floating.

OBJECTS OF THE INVENTION

It is therefore an object of the invention to provide an improved memory array.

It is another object of the invention to provide an improved memory array which has enhanced radiation hardness.

It is another object of the invention to provide an improved memory array which has better power dissipation.

It is another object of the invention to provide an improved memory array which is capable of expanded capacity static page mode operation.

SUMMARY OF THE INVENTION

These and other objects, features and advantages of the invention are accomplished by the asynchronous segmented precharge architecture disclosed herein. An improved memory array having row address inputs connected to a row address decoder and column address inputs connected to a column address decoder, the row address decoder and column address decoder having an address bus connected thereto, the memory being organized into an array of word lines organized into rows and columns having a pair of bit lines for each column, the improvement comprising, segmenting the array into a plurality of segments, each segment containing a portion of all of the bit lines; a bit equalization circuit for each said section, to equalize the potential on each bit line in the bit line pair when activated; an equalization circuit control means, having an input coupled to said input address lines, and an output connected to each equalization circuit on each respective segment of the array, for enabling the equalization circuits on those segments of the array which are not selected by the input address and for disabling the equalization circuits on that segment of the array which is selected by the input address; the bit line pairs in the non-selected circuits being maintained in an equal potential state so that when one of the bit lines in a bit line pair in a non-selected segment suffers a discharge due to an ionizing radiation effect, the activated equalization circuit on the non-selected segment will equalize and precharge the potential thereof; whereby the radiation immunity of the memory array is improved. The resulting memory array has enhanced radiation hardness, reduced power dissipation, and is capable of extended static page mode operation.

A key advantage of the invention is that it extends the static page mode across section boundaries. The section addresses do not feed the ATD circuit, and changing a section address does not cause an ATD pulse as required in the prior art. Thus, the number of columns available in the static page mode for the invention is equal to the number of columns in a section times the number of sections. Applying the invention to the scheme shown in FIG. 1 would result in a static page mode of 32 times two or 64 columns or twice the prior art example circuit.

The invention eliminates the problem of large current spikes by limiting the number of precharge devices switching to one section (typically 32) at a time. The invention eliminates the problem of floating bit lines by keeping all sections, except the selected (active) one, in a precharged equalized state. The bit lines in the selected (active) section are driven by the cell; thus, no bit lines are left floating.

BRIEF DESCRIPTION OF THE DRAWINGS

These and other objects, features and advantages of the invention will be more fully appreciated with reference to the accompanying figures.

FIGS. 6A and 6B show a detailed circuit diagram of the segmented precharge architecture, showing in particular multiple sections using the invention.

DESCRIPTION OF THE BEST MODE FOR CARRYING OUT THE INVENTION

Figures 3, 4:
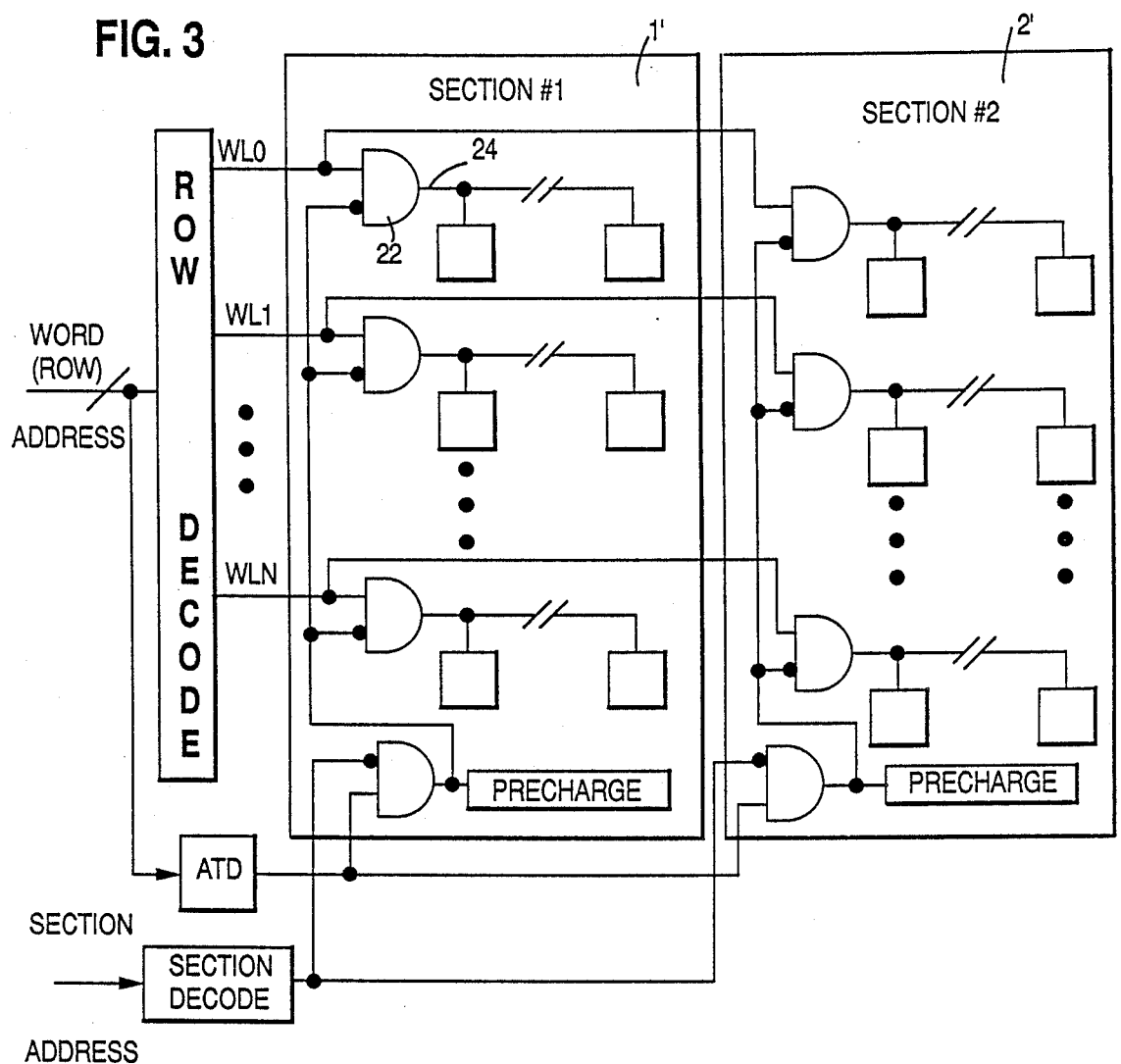
FIG. 3 is an organizational diagram of a segmented precharge architecture, in accordance with the invention.
FIG. 4 is a truth table for section control for the segmented precharge architecture of the invention, with reference to FIG. 3.

FIG. 3 shows the segmented precharge architecture invention. A separate section control circuit 30 in FIG. 5 controls the word line enable and the precharge state of each section 1 and 2. The operation of the section control circuit 30 is shown in the truth table contained in FIG. 4. Specifically, all inactive sections, e.g. section 2 in FIG. 6B, are in precharge regardless of the state of the ATD pulse. And, the ATD pulse forces the active word line, e.g. 24, to turn off and the active section, e.g. section 1 in FIG. 6A, into precharge.

There are four advantages to the segmented precharge architecture:

1. All Bit Lines are Actively Driven. The section control circuits 30, 30' ensure that all bit lines in unselected sections are in precharge. The bit lines in the select section are driven by memory cells connected to them.

2. The Static Page Mode is Extended Across Section Boundaries. Since unselected sections of section 2 in FIG. 6B, are in precharge, changing section address need not trigger a precharge pulse (the new section is already precharged). Thus, the number of columns (bits) available for the static page mode is the number of columns in a section times the number of sections. For example, a 64K SRAM with 16 sections of 32 columns each results in a static page mode of 16 times 32 or 512 columns (bits).

3. Reduces Current Transients Due to Switching Precharge Devices. When the ATD pulse 32 is inactive, all bit line precharge devices are on except those in the active section e.g. section 1. When the ATD pulse 12 goes active, only the precharge devices in the active section turn on—the remaining precharge devices are already on. Thus, the number of precharge devices switching is limited to one section having, for example, 32 bit line pairs. Switching transients due to the precharge pulse has been a major problem in prior art RAM design. This invention eliminates these problems.

4. Simplifies Internal Timing. Overlapping the operation of turning on the precharge with turning off the word line interferes with precharging the bit lines and dissipates power. Overlapping the operation of turning off the precharge with turning on the word line, delays the read access by preventing the cell from putting data on the bit lines. The segmented precharge architecture, which has a separate section control circuit 30 for each section 1, 2, etc., simplifies this timing concern by decentralizing the control of the timing across the chip. This results in a more direct control of the word lines and precharge devices. Fewer circuits are involved in the control and the circuits that are involved drive much lighter loads. Thus, the timing is simpler and easier to predict.

Figure 5:
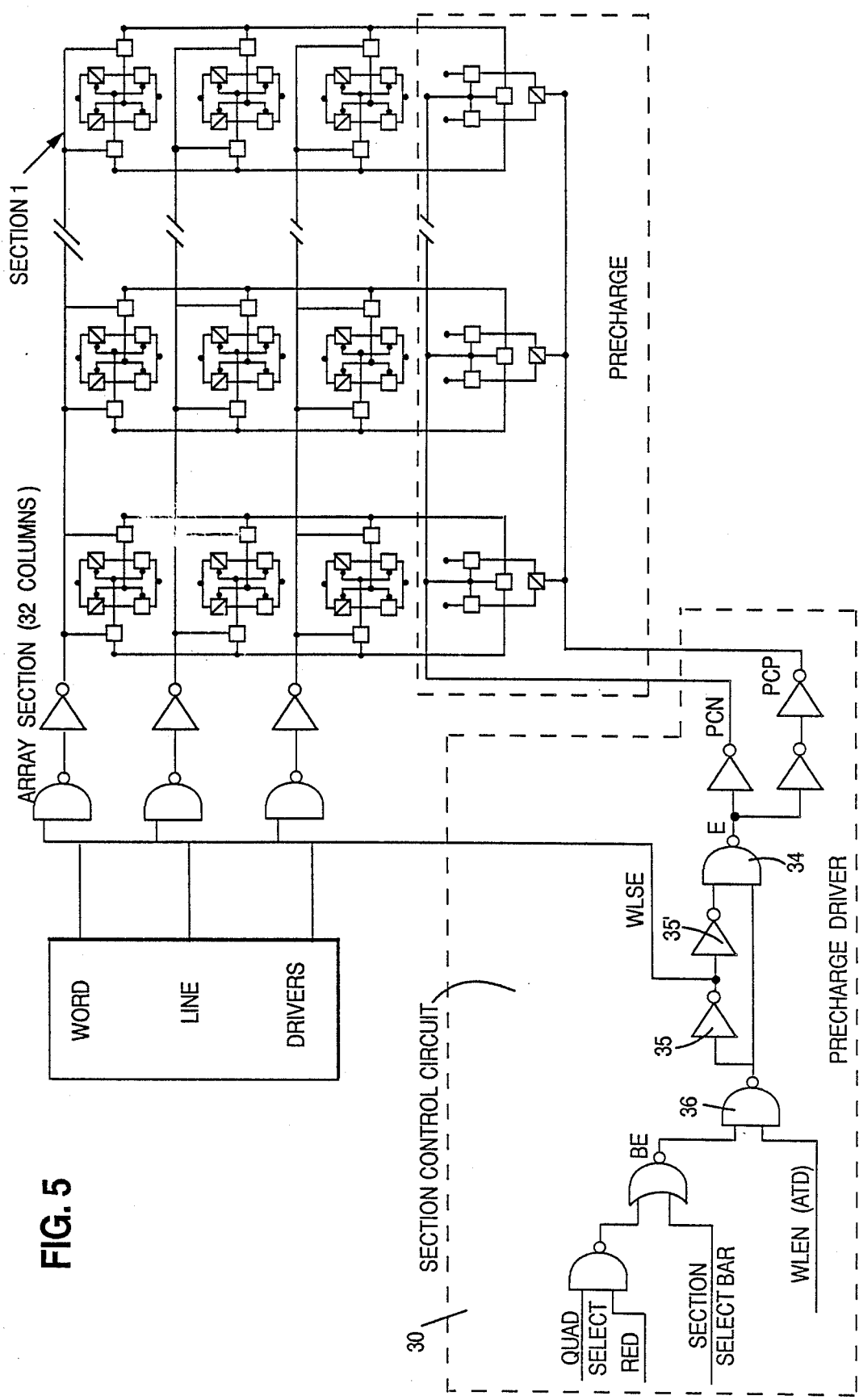
FIG. 5 is a more detailed circuit diagram of the segmented precharge architecture, in accordance with the invention.

Although this scheme was developed for a radiation hardened SRAM, it is equally applicable to non-radiation hardened SRAMs. The specific implementation of the segmented precharge architecture used on a 64K SRAM is shown in FIG. 5. For clarity only one array section is shown. Note the NAND gates 34 and 36 in conjunction with inverters 35 and 35' which prevent the turning on of the precharge from overlapping with the turning off of the word line.

Figure 7:
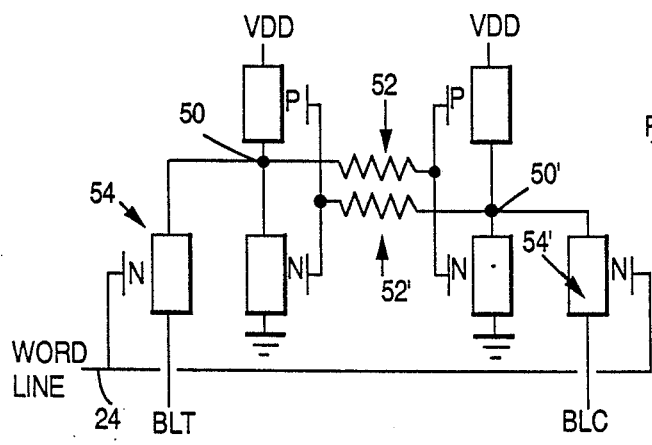
FIG. 7 is a circuit schematic diagram of a radiation hardened memory cell 40.
Figure 8:
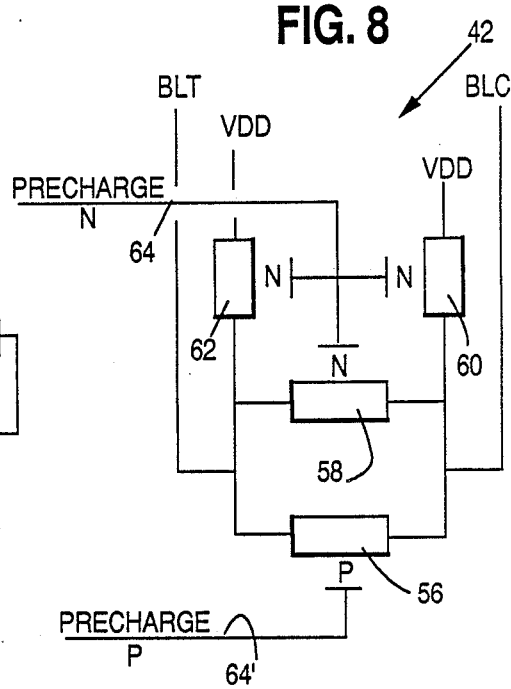
FIG. 8 is a circuit schematic diagram of the precharge/equalization circuit 42.
Figure 9:
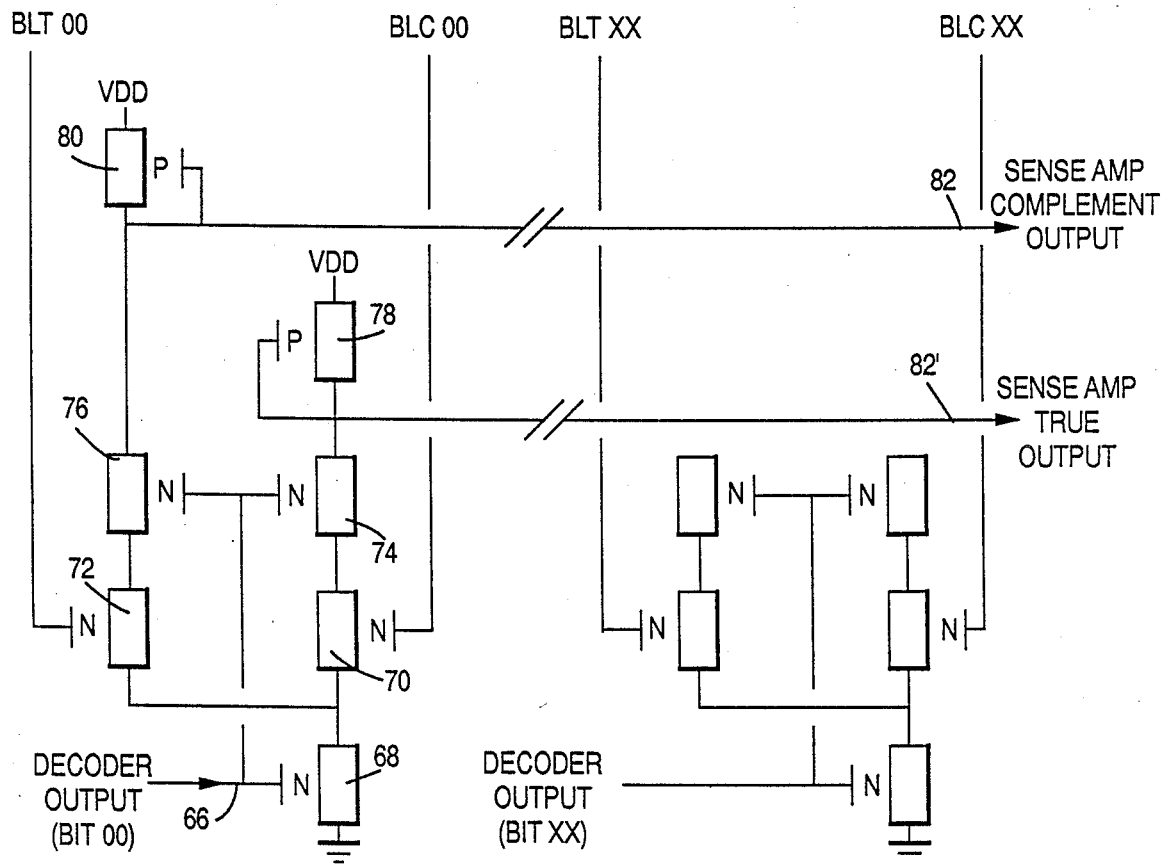
FIG. 9 is a circuit schematic diagram of the differential sense amplifier/multiplexer 44.
Figure 10:
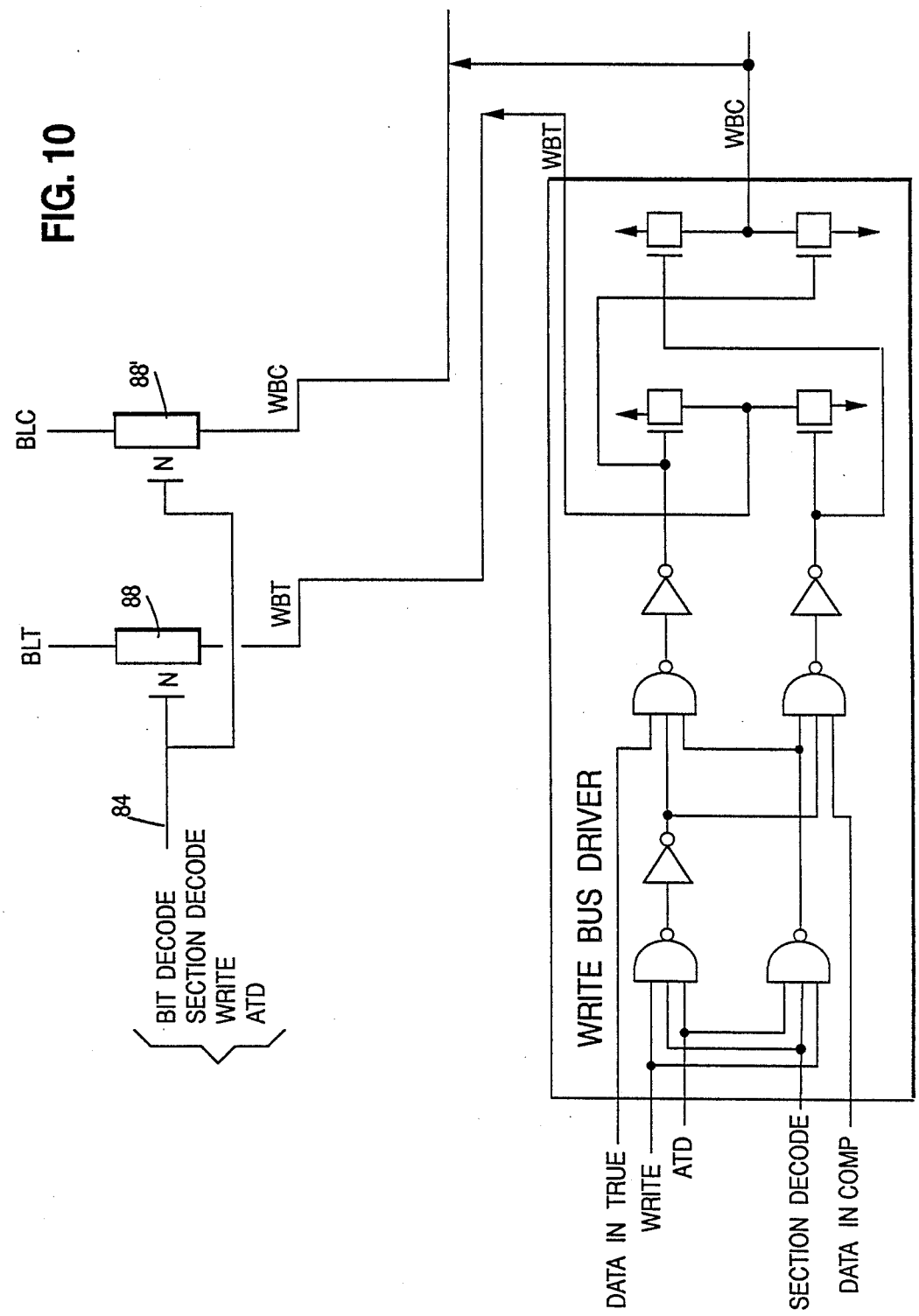
FIG. 10 shows a circuit schematic diagram of the write driver 46.
Figure 11:
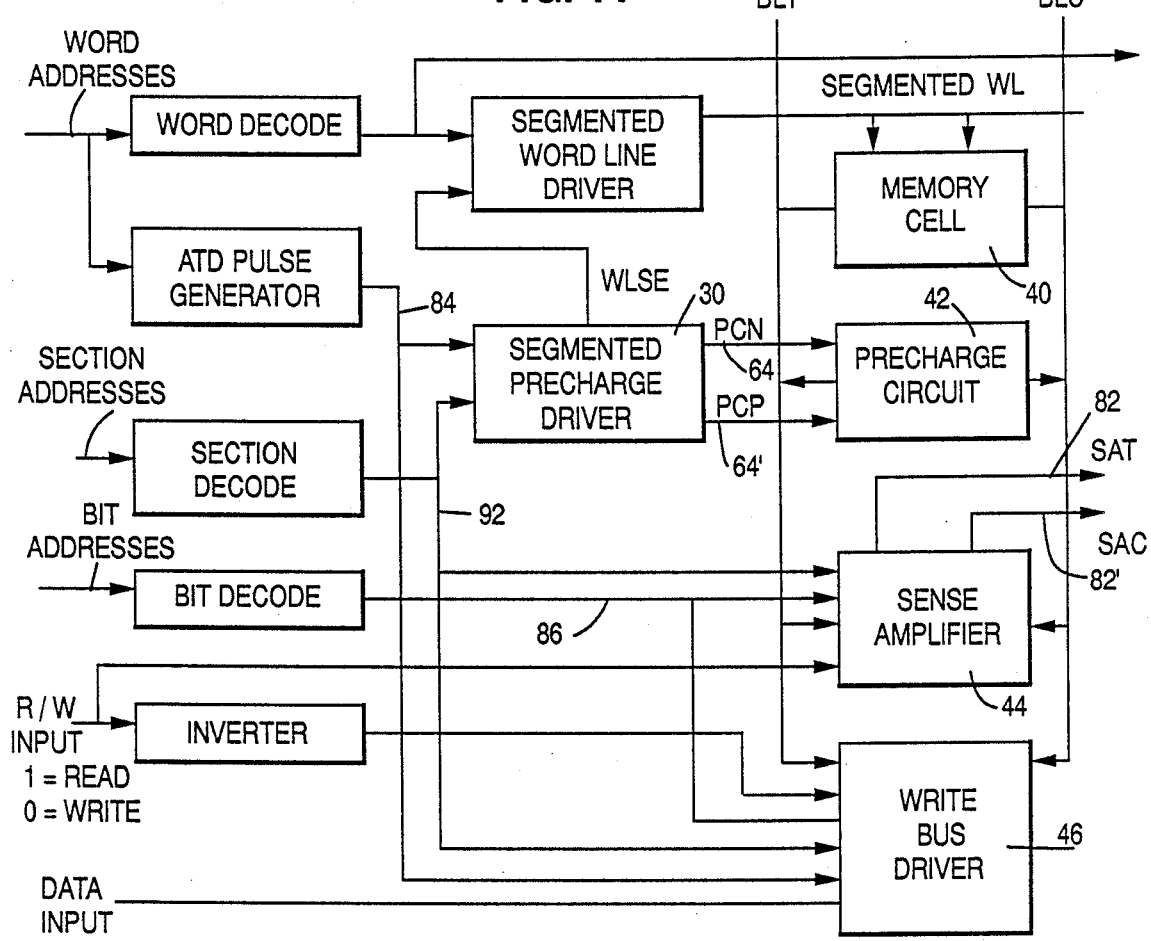
FIG. 11 is an overall circuit block diagram illustrating the interconnection of the memory cell shown in FIG. 7, the precharge circuit shown in FIG. 8, the sense amplifier circuit shown in FIG. 9, and the write driver circuit shown in FIG. 10 and segmented precharge driver of FIG. 12.
Figure 12:
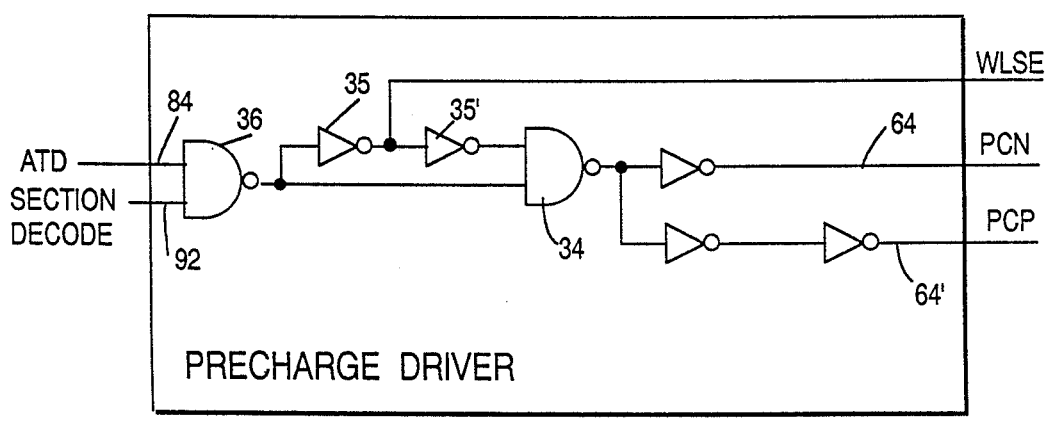
FIG. 12 is a circuit schematic diagram of the segmented precharge driver circuit.

FIG. 11 is an overall block diagram which illustrates the interconnection of the memory cell FIG. 7, the precharge circuit FIG. 8, the sense amplifier FIG. 9, and the write driver FIG. 10, along with the segmented precharge driver in FIG. 12. Referring to FIG. 7, the memory cell is connected through the transfer N-channel FET gates 54 and 54' to the bit lines BLT and BLC, respectively. As is shown in FIG. 7, the word line 24 is applied to the gates of two N-channel devices 54 and 54', and when enabled, connects the nodes 50 and 50' of the static flip-flop circuit 40, to the bit lines BLT and BLC, respectively. The static flip-flop circuit shown in FIG. 7 is a conventional design and has a special radiation hardening feature in the form of added resistors 52 and 52', which separate the node 50, for example, from the gates of the corresponding inverter. This is a conventional radiation hardening circuit configuration. It is within the scope of the invention to have a standard FET CMOS flip-flop storage cell without the radiation hardening resistors 52 and 52'. Reference to FIG. 11 will show how the memory cell of FIG. 7 is connected to the bit lines BLT and BLC.

In FIG. 11, the precharge circuit of FIG. 8 is shown connected to the bit lines BLT and BLC and is driven by the segmented precharge driver through line 64 labeled PCN and line 64' labeled PCP. Reference to FIG. 8 will illustrate the precharge/equalization circuit. As can be seen, the circuit consists of a P-channel FET device 56 and an N-channel FET device 58 which are connected in parallel and coupled between the bit lines BLT and BLC. When the precharge N(PCN) line 64 and the precharge P(PCP) line 64' are activated, the polarity of the voltages on those lines is that line 64 is relatively positive and line 64' is relatively negative, thereby rendering the N-channel FET device 58 conductive and the P-channel FET device 56 conductive, thereby creating a relative short between the bit lines BLT and BLC so as to equalize any charge which might reside on the two bit lines. In accordance with the invention, the precharge N line 64 and the precharge P line 64', will be energized when the bit lines in columns residing in a non-selected segment of the memory, are to be equalized. It will be recalled that the bit lines non-selected segments are maintained in an equalization state so as to insure that both lines will remain at a relatively positive and substantially equal potential. Reference to FIG. 8 will further show the N-channel FET devices 60 and 62 which are also connected to the precharge N(PCN) line 64 and are rendered in their conductive state when the precharge N line 64 is relatively positive. This will connect the bit line BLT and the bit line BLC to the relatively positive supply voltage VDD, thereby providing the precharge source of power to the bit lines BLT and BLC. Thus, the precharge potential is applied to the bit lines BLT and BLC for the duration that the segment is in a non-selected state. The potential which is applied to the bit lines BLT and BLC is the potential VDD minus a threshold voltage of the N-channel FET devices 60 and 62. The value of VDD minus VT, which of course is less than the full value VDD, provides an advantage in the design of the circuit since the precharge potential VDD minus VT does not require the same length of time to achieve on a bit line than would the full VDD potential if one were to attempt to apply it to the bit lines. Thus, the time required to precharge the bit lines to the design potential of VDD minus VT is less. In addition, power dissipation is lower since charging/discharging a capacitor (BLT and BLC in this case) is directly proportional to the voltage squared. In accordance with the invention, the segmented precharge driver 30 will make the precharge N(PCN) line 64 change to a low potential and will change the precharge P(PCP) line 64' to a high potential when the segment is accessed. This will decouple the precharge voltage from the bit lines BLT and BLC and decouple BLT and BLC from each other (equalization) so as to enable either reading or writing operations to occur.

Reference again to FIG. 11 will show how the sense amplifier is connected to the bit lines BLT and BLC. The sense amplifier 44 is shown in more detail in FIG. 9 which illustrates the decoder and read/write select lines 66 which are applied to the sense amplifier circuit to enable it. The circuit shown in FIG. 9 consists of the N-channel FET device 68, the N-channel FET device 70 and the N-channel FET device 74, which are serially connected between ground potential and the output node 82', to which is connected the P-channel FET device 78 which serves as a resistive load device. The P-channel FET device 78 is connected to the supply potential VDD. Also shown in the figure are the N-channel FET devices 72 and 76 which are serially connected with the N-channel FET device 68 to ground potential and are also connected to the output node 82, to which is connected the P-channel FET device 80. The P-channel FET device 80 serves as a second resistive load and is connected to the supply potential VDD. When the decoder and read/write select lines 66 are energized to a relatively positive potential, the N-channel FET devices 68, 74 and 76 are rendered conductive. If the bit line BLT has a positive potential and the bit line BLC has a relatively negative or zero potential, indicating the stored information state of one of the memory cells selected in this particular column, then the N-channel FET device 72 is rendered conductive and the N-channel FET device 70 is rendered non-conductive. In this state, the ground potential is conducted through FET devices 68, 72 and 76 to the output node 82. Correspondingly, since the FET device 70 has its gate connected to the BLC bit line which is relatively negative, the FET device 70 is in a non-conductive state and this insulates the ground potential from the output node 82'. Since the P-channel FET device 78 is a resistive load device connected to the relatively positive VDD potential, the output node 82' is relatively positive. Thus, the amplified binary state of the bit lines BLT and BLC are applied to the output lines 82 and 82'.

Reference again to FIG. 11 will show how the write driver 46 is connected to the bit lines BLT and BLC. It will be seen that the address transition detector (ATD) output 90 is applied as one input to the write driver 46. This signal is applied on line 84 to the write driver 46. Also, the read/write select line and the section decode line 92 and the bit decode line 86 are applied to the write driver. As can be seen in FIG. 10, the write bus driver takes the binary input information and applies it to the complementary output lines WBT and WBC which are input to the bit switch comprising transistors 88 and 88'. In FIG. 10, the N-channel FET devices 88 and 88' are gated by the section decode, the bit decode, the read/write select, and the ATD signal on line 84. When a section is selected and a column is selected within that section and a write condition is indicated and the address transition detector indicates that a new address has just been applied to the circuit, the bit switch devices 88 and 88' are enabled by the gate enable line 86. This applies the complementary signals on WBC and WBT lines to the bit lines BLT and BLC so that one of the bit lines BLT will be driven to one polarity and the other bit line BLC will be driven to the opposite polarity. During the same interval, the selected row will have its word line 24 energized thereby rendering conductive the transfer gates 54 and 54' for the accessed memory cell 40, so that the polarity state of the bit lines can be applied to the respective nodes 50 and 50' of the static flip-flop storage cell.

Reference now back to FIG. 11 will illustrate how the segmented precharge driver 30 is connected in the circuit. It can be seen that the segmented precharge driver circuit 30 has as one input the output 84 from the address transition detector and has as another input 92 the section decode output. The principle of operation in the precharge driver of FIG. 12 is to turn off all of the word lines in a selected section and thereafter to turn on the precharge circuit in the selected section when the address transition detector has detected a change in the row address being applied to the circuit and to reverse this operation for the duration of the ATD pulse. This is accomplished by having the NAND gate 36 have as its two inputs the ATD input 90 and to have the segment select input 92. The NAND gate 34 in the precharge driver then, after the delay imposed by the two inverters 35 and 35', will send an enabling signal on the lines PCN and PCP to the precharge circuits 42 for all of the columns in the selected segment. In this manner, the timing requirements for turning off the respective cells and turning on the precharge circuits in the array is distributed as a function to each respective segment.

Figure 13:
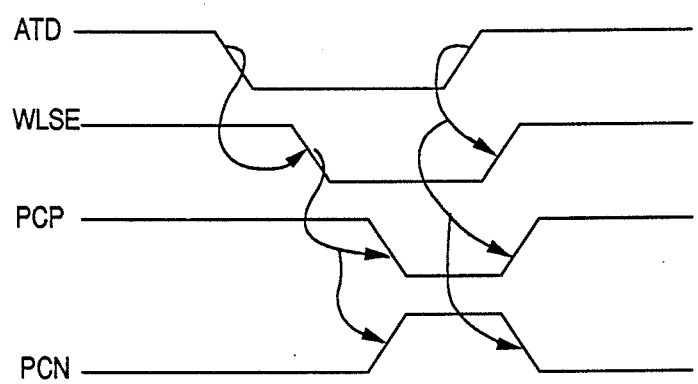
FIG. 13 is a waveform diagram illustrating the operation of the segmented precharge driver 30.

FIG. 13 is a waveform diagram illustrating the sequence of operations for the segmented precharge driver circuit 30. As can be seen, the ATD waveform which is input on line 84 transitions downward and by virtue of this segment being selected on line 92, after a predetermined delay applied by the NAND gate 36 in FIG. 12 and the inverter 35, the word line select (WLSE) line transitions downward, thereby turning off all of the transfer gates 54 and 54' for all of the memory cells 40 in the segment. As can be seen further in FIG. 13, after a further predetermined delay which is applied by the inverter 35' and the NAND gate 34, the complementary signals PCN and PCP on lines 64 and 64' respectively, are then applied to the precharge circuit 42 to thereby initiate the application of the precharge potential and the equalization condition to the bit lines BLT and BLC for all of the memory cells in the selected segment. This operation takes place when the address transition detector detects that a different word line from the current word line is being addressed. In the case where only a section address changes, the section decoder output turns on the previous accessed section precharge (PCP goes low, PCN goes high) and turns off the word lines (24) via WLSE going low. In the new section, the changing section decoder output acts as the rising edge of the ATD signal in FIG. 13 and, therefore, turns on WLSE while turning off the precharging (PCN goes low, PCP goes high). Therefore, the new section comes out of precharge and into the access mode, while the old section comes out of access and into precharge. Note that no ATD pulse is required since all non-selected sections are driven into precharge.

Figure 14:
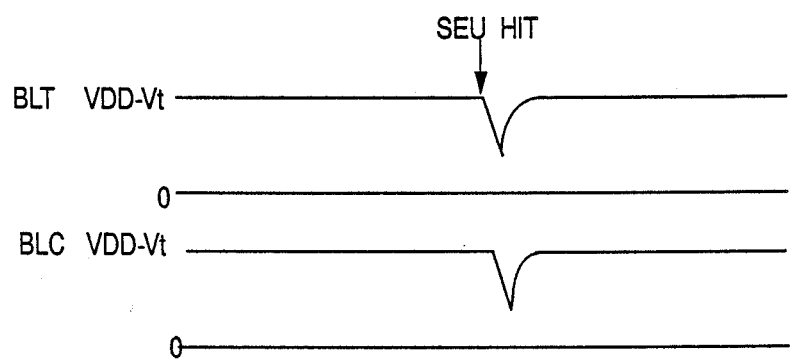
FIG. 14 is a waveform diagram showing the exemplary improvement of the invention in its enhanced ability to recover from a single event upset.
Figure 15:
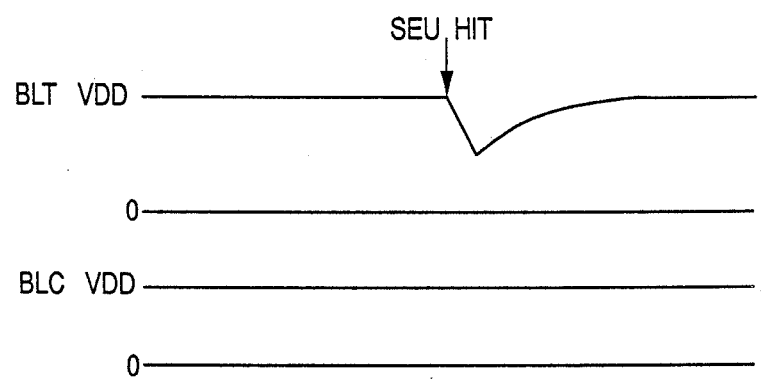
FIG. 15 is a waveform diagram illustrating the relatively poor response of a prior art circuit to a similar single event upset as was experienced in association with the waveform diagram of FIG. 13.

FIG. 14 is a voltage waveform diagram illustrating the reaction of the bit lines in the circuit, in accordance with the invention, when a single event upset occurs on one of the two bit lines. In particular, in FIG. 14, in accordance with the invention, when the bit line BLT suffers a single event upset so that a momentary negative voltage transition occurs on BLT, if the single event upset occurs on the bit line which is in a non-selected segment, then because the equalization circuit 42 has its FET devices 56 and 58 in a conductive state in accordance with the invention, and because the precharge devices 60 and 62' are also in a conductive state, the potential on the two bit lines BLT and BLC is immediately adjusted to become equalized in a short period of time and the precharge potential is applied to both bit lines to return both bit lines to the full precharge potential of VDD minus VT. This enables the non-selected segment to be readily available for selection to write or read a storage cell therein a short time after the occurrence of a single event upset. This high availability feature of the invention is not available in the prior art. This can be seen with reference to FIG. 15 which shows the behavior of a typical prior art memory circuit with small passive pullups on the bit lines in which one of the pair of bit lines suffers a single event upset. If the pair of bit lines is in a non-selected segment, because there is no precharge or equalization circuit (except small passive pullups) which is enabled during the non-selected interval for the segment, a much longer period of time is required to reconstitute the state of the two bit lines after the single event upset. This delays the availability of the non-selected segment for subsequent accessing after the single event upset.

Figure 1:
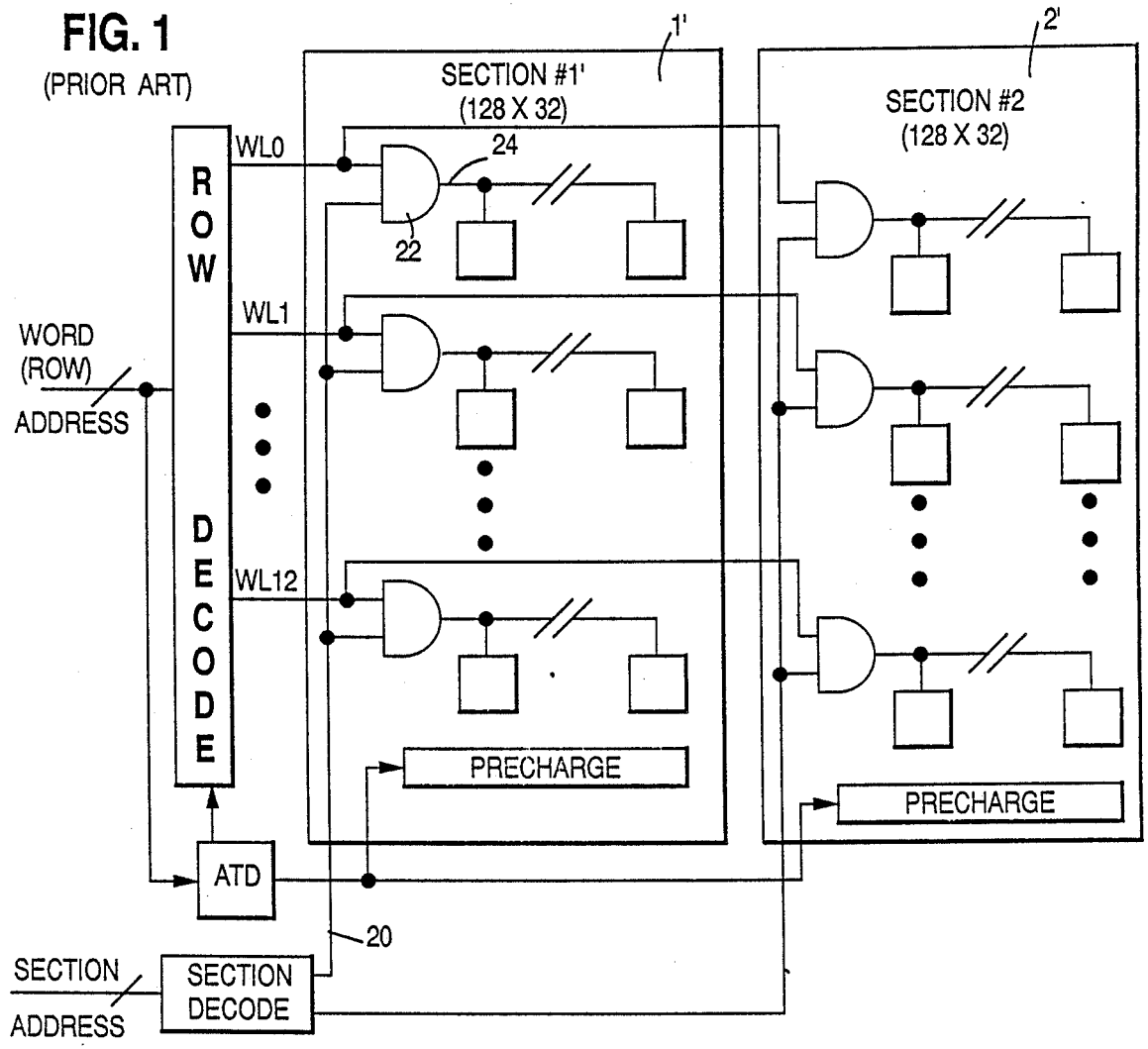
FIG. 1 is an organizational diagram of an example of prior art segmented word line architecture.
Figure 2:
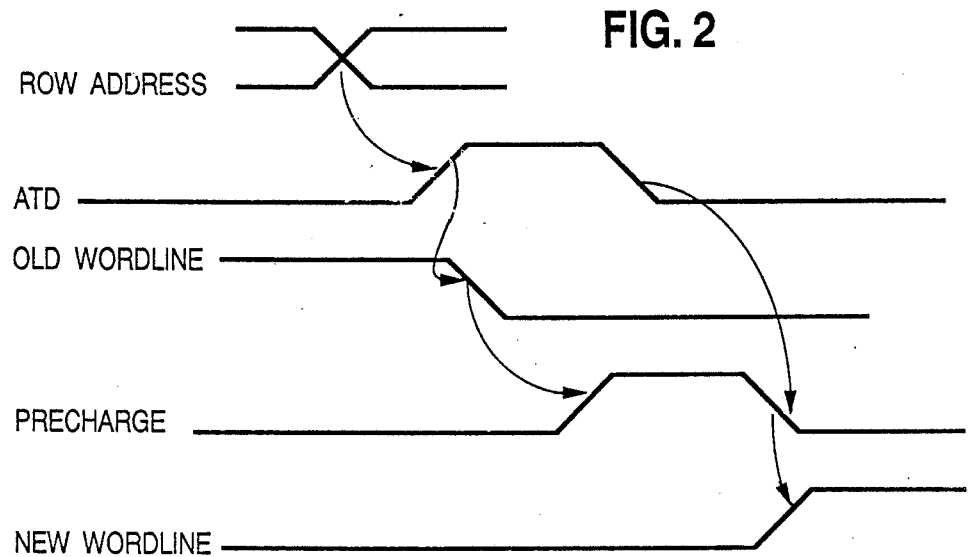
FIG. 2 is a waveform diagram of the address transition detection timing sequence, in accordance with the invention.

Most memory chips equal to or larger than 64K use a segmented word line architecture. A typical prior art example of the segmented word line architecture was discussed for FIG. 1. The invention improved upon the prior art by segmenting the precharge as well as the word line. In conclusion, the advantages of the segmented precharge architecture are:

1. Increases the number of bits in static page mode (e.g. 32 increased to 512 on the 64K).
2. Reduces current transients due to the switching of precharge devices.
3. All bit lines are actively driven—all inactive portions of the chip are in precharge.
4. Simplifies internal timing by distributing it at a lower level.

The resulting memory array has an enhanced radiation hardness characteristic, has a reduced power dissipation characteristic, and is capable of static page mode operation.

Although a specific embodiment of the invention has been disclosed, it will be understood by those having skill in the art that changes can be made to the specific embodiment without departing from the spirit and the scope of the invention.

What is claimed is:

1. An improved memory having enhanced power dissipation, enhanced radiation hardness, and capable of enhanced static page mode operation, comprising:

a row decode means having an input connected to an input address bus, and including an address transition detector, for outputting an ATD signal when the address on the address bus changes, said row decoder having output lines connected to the word lines of a memory array;

said memory array being organized into a plurality of segments, each segment having a plurality of columns of storage devices, each column including a pair of bit lines, each bit line in each respective pair being connected to one of a pair of storage nodes for each storage cell in a column;

each segment of said plurality of segments in said array containing a precharge means which includes an equalization circuit connected to each pair of bit lines in each respective column in the segment, for precharging and equalizing the bit lines in the segment when the segment is not being accessed; control means having an input connected to said address transition detection means and a control output coupled to each equalization circuit, for momentarily enabling the equalization circuit for each accessed segment in said array, when said ATD signal signifies a row address change;

segments not being accessed are thereby capable of reinstating balance potentials on respective bit line pairs which have incurred discharge due to ionizing radiation effects.

2. An improved memory array having row address inputs connected to a row address decoder and column address inputs connected to a column address decoder, the row address decoder and column address decoder having an address bus connected thereto, the memory being organized into an array having word lines organized into rows and columns having a pair of bit lines for each column, the improvement comprising:

said array being segmented into a plurality of segments, each segment containing a portion of all of said bit lines;

a bit equalization circuit for each said segment, for precharging and equalizing the potential on each bit line in a bit line pair, when activated;

a precharge and equalization circuit control means, having an input coupled to said input address lines, and an output coupled to a precharge and equalization circuit in each respective segment of said array, for enabling said precharge and equalization circuits on those segments of the array which are not selected by said input address and for disabling the precharge and equalization circuits on that segment of the array which is selected by the input address;

said bit line pairs in segments not selected by said input address being maintained at a substantially equal voltage so that when one of said bit lines in a bit line pair in a segment not selected by said input address suffers a discharge due to an ionizing radiation effect, said activated precharge and equalization circuit on the non-selected segment will equalize the potential thereof;

whereby the radiation immunity of the memory array is improved.

3. The memory array of claim 2 which further comprises:

said precharge and equalization circuits including precharging means for precharging both bit lines in a bit line pair to a potential less than the supply of voltage for the memory;

whereby the power dissipation required for precharging said lines is minimized.

4. The memory array of claim 2 wherein:

said bit line pairs in segments not selected by said input address of said array have substantially equal potentials and are precharged thereby enabling the immediate selection of storage elements in said non-selected segments following the accessing of storage elements in a segment of the array which is selected by the input address, without the necessity of engaging in a precharge cycle;

whereby high speed static paging operations can be carried out.

* * * * *